United States Patent
Ogawa et al.

(10) Patent No.: US 7,023,132 B2
(45) Date of Patent: Apr. 4, 2006

(54) ORGANIC EL DISPLAY ELEMENT

(75) Inventors: Akio Ogawa, Tokyo (JP); Koichi Takayama, Tokyo (JP); Atsushi Nagasaki, Tokyo (JP); Yasuro Kingo, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 97 days.

(21) Appl. No.: 10/618,723

(22) Filed: Jul. 15, 2003

(65) Prior Publication Data

US 2004/0061436 A1    Apr. 1, 2004

(30) Foreign Application Priority Data

Sep. 27, 2002   (JP)   ............................... 2002-282912

(51) Int. Cl.
*H05B 33/14* (2006.01)
*H05B 33/22* (2006.01)

(52) U.S. Cl. ..................... 313/506; 313/503; 313/509
(58) Field of Classification Search ............... 313/503, 313/504, 506, 509; 428/690
See application file for complete search history.

(56) References Cited

U.S. PATENT DOCUMENTS 5,343,050 A  *  8/1994  Egusa et al. ............. 313/504
2003/0011301 A1 *  1/2003  Sasaoka et al. .......... 313/506

FOREIGN PATENT DOCUMENTS

JP           11339969 A  * 12/1999
JP        2000133462 A  *  5/2000

* cited by examiner

*Primary Examiner*—Mariceli Santiago
(74) *Attorney, Agent, or Firm*—Dickstein, Shapiro, Morin & Oshinsky, LLP.

(57) ABSTRACT

In conventional organic EL display elements of this type, unevenness of brightness surely occurs at high temperatures. These conventional organic elements cannot be used in, for example, display devices to be mounted on vehicles, giving rise to the problem of inferior generalities. An organic EL display element 1 according to the present invention comprises a stress relaxation layer on a cathode after the cathode is formed, the stress relaxation layer being a film which exhibits tensile stress when the film stress of the cathode is compressive stress or exhibits compressive stress when the film stress of the cathode is tensile stress. This structure allows the organic EL display element to prevent the occurrence of unevenness of brightness caused by the film stress of the cathode to solve the problem and makes it possible to give generalities to organic EL display elements of this type.

10 Claims, 1 Drawing Sheet

ORGANIC EL DISPLAY ELEMENT

FIELD OF THE INVENTION

The present invention relates to an EL display element which converts electric energy into light energy by injecting a current to a luminous layer to display by spontaneous light, and particularly to an organic EL display element in which an organic luminous layer such as an aluminum complex of 8-hydroxyquinoline is adopted as the luminous layer.

BACKGROUND ART

FIG. 2 and FIG. 3 show an example of a structure when making a dot matrix display by a conventional organic EL display element. 90. A transparent electrode 92 consisting of an ITO is stripe formed on a transparent substrate 91. A hole transfer layer 93, an organic luminous layer 94 and a stripe cathode 95 which is almost perpendicular to the transparent electrode 92 are formed in this order on the transparent electrode 92 by a vacuum deposition method or the like to make a luminous section 96 (see FIG. 3).

Although illustrations are omitted, a structure in which a hole injection layer is disposed between the ITO transparent electrode 92 and the hole transfer layer 93, a structure in which an electron transfer layer is disposed between the organic luminous layer 94 and the cathode 95 and a structure provided with both the hole injection layer and the electron transfer layer are also proposed as the luminous section 96.

Here, the luminous section 96 is significantly deteriorated by moisture and the like in the atmosphere and therefore has a short life. As shown in FIG. 3, therefore, a sealing substrate 97 is disposed on the backside of the cathode 95, the surrounding of the luminous section 96 is sealed by a sealing agent 98 and further a drying agent is disposed inside of the sealed space, thereby making it possible to extend the life of the luminous section 96.

SUMMARY OF THE INVENTION

However, if the aforementioned organic EL display element 90 having a conventional structure is, for example, allowed to stand under the circumstance such as the room of a car parked under a burning sun in a summer season where the surrounding temperature is high, this gives rise to the problem that porphyritic unevenness of brightness occurs on the surface of the luminous section in a relatively short time, bringing about a remarkable deterioration in display quality.

The present invention provides, as specific means to solve the conventional problem, an organic EL display element comprising an anode, an organic layer consisting of plural materials and layers, an electron injection layer and a cathode which are laminated in this order on a substrate, the display element further comprising a stress relaxation layer formed on the cathode after the cathode is formed, the stress relaxation layer being a film which exhibits tensile stress when the film stress of the cathode is compressive stress or exhibits compressive stress when the film stress of the cathode is tensile stress, to thereby solve the problem.

DETAILED DESCRIPTION OF THE INVENTION AND PREFERRED EMBODIMENT

Figure 1:
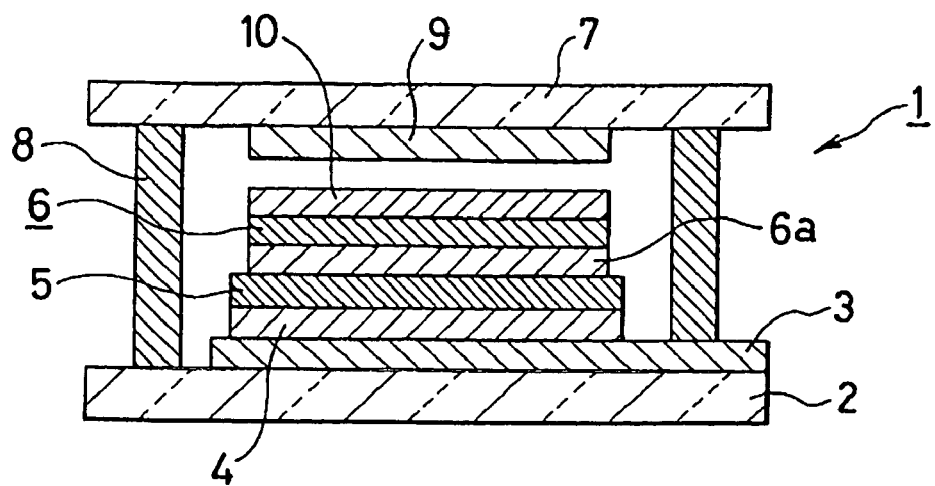
FIG. 1 is a sectional view showing an embodiment of an organic EL display element according to the present invention.
Figure 2:
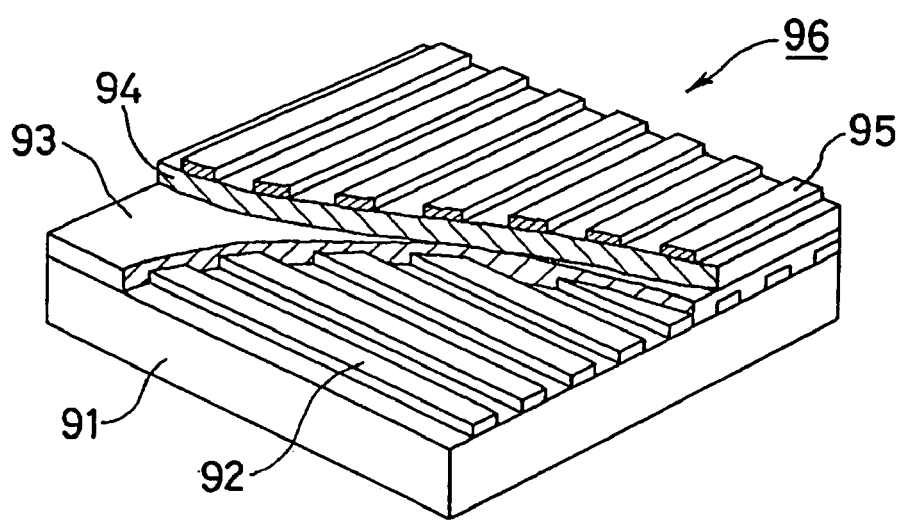
FIG. 2 is an explanatory view showing the essential part of a conventional example.
Figure 3:
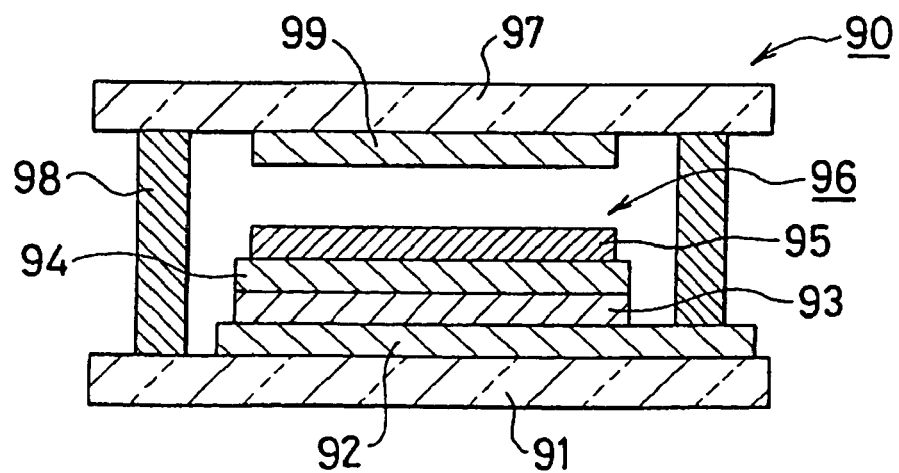
FIG. 3 is a sectional view showing a conventional example.

Next, the present invention will be explained in detail based on an embodiment shown in the drawings. FIG. 1 is a sectional view of an organic EL display element 1 according to the present invention. Explanations will be furnished using an example in which an organic EL display element 1 has a structure comprising a transparent substrate 2, a transparent electrode 3, a hole transfer layer 4, an organic luminous layer 5, a cathode 6, a sealing substrate 7, a sealing agent 8 and a drying agent 9 also in the present invention.

Here, in the present invention, a stress relaxation layer 10 is disposed on the back of the cathode 6. As this stress relaxation layer 10, a film exhibiting a compressive stress is selected when the cathode 6 exhibits tensile stress and a film exhibiting a tensile stress is selected when the cathode 6 exhibits compressive stress.

Examples of materials exhibiting compressive stress include $SiO_2$, $CeO_2$ and $Y_2O_3$ and examples of materials exhibiting tensile stress include Cu, In, Mg, Mn, Ni, Mo, Ti, $MgF_2$, MgO, SiO, $GeO_2$, ZnO, $Si_3N_4$ and $Mn_2O_3$. A mixed film or composite layer film consisting of two or more types of materials may be adopted to control the value of film stress.

The film thickness of the stress relaxation layer 10 is controlled such that the absolute value of the sum of the film stress of the cathode 6 and the film stress of the stress relaxation layer 10 is 10 (N/m) or less and preferably 5 (N/m). The film thickness of the stress relaxation layer 10 may take various values corresponding to the film stress of the cathode 6 and the film stress exhibited by a material selected as the stress relaxation layer 10.

For example, in the case where the film stress exhibited by the cathode 6 is −10 (N/m) as compressive stress, the film stress of the stress relaxation layer 10 is preferably about 10 (N/m) as tensile stress. Therefore, in the case of Mn exhibiting an internal stress of about $10 \times 10^3$ ($N/m^2$) as tensile stress, the film thickness is preferably about 10 nm. In the case of Ti exhibiting an internal stress of about $0.5 \times 10^3$ ($N/m^2$) as tensile stress, the film thickness is preferably about 200 nm.

In the meantime, there is the case where a protective film (not shown) is added to the cathode 6 depending on the structure of the organic EL display element 1. When plural layers are disposed on the cathode 6 in this manner, the sum of the film stresses of these plural layers may be regarded as the film stress of the cathode 6 side to form the stress relaxation layer 10 corresponding to this film stress. Also, in this case, the order of the protective film and the stress relaxation layer 10 on the cathode 6 is optional.

Next, the structure of each part of the organic EL display element 1 will be explained. First, as the transparent substrate 2, glass, PET resins, polycarbonate resins, amorphous polyolefin resins and the like are adopted. Although as the transparent electrode 3, a transparent conductive film consisting of a conductive material having a large work function such as ITO, $SnO_2$ and ZnO is preferably adopted, a semi-transparent film such as Au may be used.

As the cathode 6, metals such as Al, In, Mg and Ti, Mg type alloys such as an Mg—Ag alloy and an Mg—In alloy and an Al type alloys such as an Al—Li alloy and an Al—Sr alloy are adopted. Also, a thin film of a metal having a low work function such as Li, Ca, Sr and Cs or a metal fluoride or oxide having a low work function such as LiF, CaF and LiO may be formed as the electron injection layer 6 a and a metal may be formed as the cathode 6 on the thin film.

As the hole transfer layer 4, a material which has high hole mobility, is transparent and good filming characteristics is preferable. Besides triphenylamine derivatives such as TPD (triphenyldiamine), polyolefin type compounds such as phthalocyanine and copper phthalocyanine, hydrazone derivatives and arylamine derivatives may be adopted.

As explained in the conventional example, a layer having a hole injection function and a layer having a hole transfer function are separately disposed as the hole transfer layer 4. In this case, layer having a hole injection function increases efficiency of hole injection from the transparent electrode 3 and the layer having a hole transfer function has a function of transferring holes efficiently from the transparent electrode 3 and also a function of hindering electrons. Each film thickness of these layers is preferably 10 to 200 nm.

The organic luminous layer 5 preferably has a high luminous efficiency, is superior in thin film characteristics and does not exert a strong interaction at the boundary between layers which are in contact with each other. As the organic luminous layer 5, an aluminum chelating complex (Alq3), distyrylarylene (DSA) type derivatives such as a distyrylbiphenyl derivative (DPVBi), quinacridone derivatives, rubrene, cumalin and perylene type materials are used. These materials are used to form a film having a film thickness of 10 to 200 nm as a monolayer, plural layers or mixed layer.

As a material of the sealing substrate 7, a material having low water-vapor permeability is preferable and a metal, glass or the like is selected. Also, the sealing agent 8 which binds the transparent 2 with the sealing substrate 7 at the outside periphery is also preferably those having a low water-vapor permeability. As the seal agent 8, a heat-curable resin, photocurable resin and the like may be appropriately adopted.

The drying agent 9 may be any raw material as far as it absorbs water physically or chemically. Examples of the drying agent include materials, such as activated carbon, which are porous and adsorb water physically and materials which adsorb water by a chemical reaction or materials having the both characteristics in a manner similar to BaO. Besides the materials, aluminum hydroxide, calcium oxide, diphosphoric pentoxide, calcium sulfate, magnesium sulfate and zeolite are exemplified.

Next, the results of trial productions and studies made by the inventor of the present invention to attain the present invention will be described. In the trial production and studies, samples A to K were produced based on the stress difference arising between the cathode 6 and the stress relaxation layer 10, and were allowed to stand at a predetermined temperature (85° C.) and for a predetermined time (250 hr) to make determination. Accordingly, parts except for the cathode 6 and the stress relaxation layer 10 were all formed in the same condition.

TABLE 1

| Sample | Cathode | Stress relaxation layer | Film stress | Overall film stress | Test results |
|---|---|---|---|---|---|
| A | Al = 200 nm | Ti = 200 nm | 11(N/m) | 4(N/m) | ⊚ |
| B | Al = 40 nm | Ti = 200 nm | 11(N/m) | 9(N/m) | ▲ |
| C | Al = 200 nm | SiO = 200 nm | 7(N/m) | 0(N/m) | ⊚ |
| D | Al = 200 nm | $SiO_2$ = 200 nm | −200(N/m) | 207(N/m) | X X |
| E | Al = 200 nm | $Mn_2O_3$ = 200 nm | 54(N/m) | 47(N/m) | X X |
| F | Al = 200 nm | ZnO = 200 nm | 34(N/m) | 27(N/m) | X X |
| G | Al = 200 nm | $Y_2O_3$ = 100 nm | −27(N/m) | 34(N/m) | X X |
| H | Al = 200 nm | $CeO_2$ = 100 nm | −4(N/m) | 11(N/m) | X |
| I | Al = 200 nm | Cu = 100 nm | 13(N/m) | 6(N/m) | ○ |
| J | Al = 200 nm | In = 100 nm | 9(N/m) | 2(N/m) | ⊚ |
| K | Al = 200 nm | $MgF_2$ = 400 nm | 45(N/m) | 38(N/m) | X X |

In Table 1, the samples A to K are tabulated in respect of results excerpted as essential points of the invention. The sample A was provided with a cathode 6 which was made of aluminum (Al) and had a film thickness of 200 nm and a film stress of −7 (N/m) and with a stress relaxation layer 10 which was made of titanium (Ti) and had a film thickness of 200 nm and a film stress of 11 (N/m). At this time, the absolute value of the overall film stress of the cathode 6 and stress relaxation layer 10 was 4 (N/m). The results of a test in which this sample A was allowed to stand in the atmosphere of 85° C. for 250 hours showed that the occurrence of significant unevenness of brightness was not detected and each sample could be determined to have satisfactory durability in practical use.

In succession, as a sample B, aluminum (Al) was used to form a cathode 6 having a film thickness of 40 nm and a film stress of −2 (N/m). In turn for this cathode 6, titanium (Ti) was used to form a stress relaxation layer 10 having a film thickness of 200 nm and a film stress of 11 (N/m). At this time, the absolute value of the overall film stress of the cathode 6 and stress relaxation layer 10 was 9 (N/m). Then, the sample B was subjected to the same thermal durability test as above, with the result that the occurrence of unevenness of brightness was detected and determined to be slightly inferior in practical use.

Since the effectiveness of the stress relaxation layer 10 is confirmed from the above test results, different materials were used to form the stress relaxation layer 10 for further tests as shown below. The sample C was prepared using SiO by disposing a stress relaxation layer 10 having a film thickness of 200 nm and a film stress was 7 (N/m). At this time, the absolute value of the overall film stress was 0 (N/m). The results of a thermal durability test were good as a matter of course.

$SiO_2$ (sample D), $Mn_2O_3$ (sample E), ZnO (sample F), $Y_2O_3$ (sample G), $CeO_2$ (sample H), Cu (sample I), In (sample J) and $MgF_2$ (sample K) were used to form stress relaxation layers 10 having the absolute values of overall film stresses of 207, 47, 27, 34, 11, 6, 2 and 38 (N/m) respectively, which were then subjected to the same thermal durability test. As a result, it was confirmed that if the absolute overall film stress was 5 (N/m) or less, good results were obtained regardless of the raw material used to form the stress relaxation layer 10.

As explained above, an organic EL display element is made by the present invention, the organic EL display element comprising an anode, an organic layer consisting of plural materials and layers, an electron injection layer and a cathode which are laminated in this order on a substrate, the display element further comprising a stress relaxation layer formed on the cathode after the cathode is formed, the stress relaxation layer being a film which exhibits tensile stress when the film stress of the cathode is compressive stress or exhibits compressive stress when the film stress of the cathode is tensile stress. This structure allows the organic EL display element to be used without any problem even under such working conditions as a display of a video/audio system installed in a vehicle that there is a concern over the occurrence of unevenness of brightness at high temperatures in the case of conventional organic EL display elements. Therefore, the present invention has a remarkably excellent effect on the improvement in generalization of organic EL display elements of this type.

What is claimed is:

1. An organic El display element comprising an anode, and organic layer consisting of plural materials and layers, an electron injection layer and cathode which are laminated in this order on a substrate, the display element further comprising a stress relaxation layer formed on the cathode, the stress relaxation layer being a film which exhibits tensible stress when the film stress of the cathode is compressive stress or exhibits compressive stress when the film stress of the cathode is tensile stress such that the absolute value of the sum of film stresses (internal stress time thickness) of the cathode and the stress relaxation layers is 10 N/m or less.

2. The organic EL display element according to claim 1, wherein, when the material of the cathode is Al, and the stress relaxation layers is a stress relaxation layer made up of at least type selected from the group consisting of Cu, In, Mg, Ni, Mo, Ti, MgF, MgO, SiO, $GeO_2$, ZnO, $Si_3N_4$ and $Mn_2O_3$.

3. The organic EL display element according to claim 2, wherein when layers other than the stress relaxation layer are on the cathode, the abolute value of the sum of the film stresses of the cathode, the stress relaxation layers and the other layers is 10 (N/m) or less.

4. The organic EL display element according to claim 3, wherein the absolute value of the sum is 9 (N/m) or less.

5. The organic EL display element according to claim 3, wherein the absolute value of the sum is 6 (N/m) or less.

6. The organic EL display element according to claim 1, wherein, when layers other than the stress relaxation layer are on the cathode, the absolute value of the sum of the film stresses of the cathode, the stress relaxation layer and the other layers is 10 (N/m) or less.

7. The organic EL display element according to claim 6, wherein the absolute value of the sum is 9 (N/m) or less.

8. The organic EL display element according to claim 6, wherein the absolute value of the sum is 6 (N/m) or less.

9. The organic EL display element according to claim 1, wherein the absolute value of the sum is 9 (N/m) or less.

10. The organic EL display element according to claim 1, wherein the absolute value of the sum is 6 (N/m) or less.

* * * * *